United States Patent
Werley et al.

(10) Patent No.: US 10,034,373 B2
(45) Date of Patent: Jul. 24, 2018

(54) CIRCUIT BOARD SECURED TO BATTERY CELL USING A CIRCUIT BOARD THROUGH HOLE AND METHODS FOR WELDING THE CIRCUIT BOARD

(71) Applicant: Apple Inc., Cupertino, CA (US)

(72) Inventors: Charles W. Werley, San Jose, CA (US); Haran Balaram, Sunnyvale, CA (US); Richard L. Winslow, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/406,360

(22) Filed: Jan. 13, 2017

(65) Prior Publication Data

US 2018/0063955 A1    Mar. 1, 2018

Related U.S. Application Data

(60) Provisional application No. 62/379,174, filed on Aug. 24, 2016.

(51) Int. Cl.
| | |
|---|---|
| *H05K 7/10* | (2006.01) |
| *H05K 7/12* | (2006.01) |
| *H05K 1/11* | (2006.01) |
| *H05K 3/32* | (2006.01) |
| *H05K 1/18* | (2006.01) |

(52) U.S. Cl.
CPC ............ *H05K 1/113* (2013.01); *H05K 1/181* (2013.01); *H05K 3/328* (2013.01); *H05K 2201/0394* (2013.01); *H05K 2201/0397* (2013.01); *H05K 2203/107* (2013.01)

(58) Field of Classification Search
USPC .......................................... 361/767; 257/659
See application file for complete search history.

(56) References Cited

U.S. PATENT DOCUMENTS

| | | |
|---|---|---|
| 4,920,019 A | 4/1990 | Stoklosa et al. |
| 5,593,604 A | 1/1997 | Beasley et al. |
| 5,610,800 A | 3/1997 | Hundt et al. |
| 7,920,045 B2 | 4/2011 | Chandler et al. |
| 2011/0137414 A1* | 6/2011 | Litzke .................. A61N 1/3752 623/11.11 |
| 2012/0028082 A1 | 2/2012 | Lee et al. |
| 2014/0048944 A1* | 2/2014 | Lin ....................... H01L 23/562 257/773 |
| 2016/0262260 A1* | 9/2016 | Oyamada ............ H05K 1/0231 |

* cited by examiner

*Primary Examiner* — Andargie M Aychillhum
(74) *Attorney, Agent, or Firm* — Kilpatrick Townsend & Stockton

(57) ABSTRACT

An electronic device having a circuit board and a battery is disclosed. The circuit board may include a through hole and an electrical pad surrounding the through hole. In order to electrically couple the circuit board to the battery, and in particular, an electrode of the battery, a tab (or plaque) is placed between the electrical pad and the electrode. The tab electrically couples with the electrical pad by a soldering operation. To couple (electrically and mechanically) the tab with the electrode, a welding operation is used. The welding operation may include a laser weld providing thermal energy through a laser beam. In this regard, the laser beam passes through the through hole, thereby (partially) melting the tab and forming a weld between the tab and the electrode. Accordingly, the tab covers the through hole such that the tab is positioned to receive the laser beam.

18 Claims, 10 Drawing Sheets

CIRCUIT BOARD SECURED TO BATTERY CELL USING A CIRCUIT BOARD THROUGH HOLE AND METHODS FOR WELDING THE CIRCUIT BOARD

CROSS-REFERENCE TO RELATED APPLICATION(S)

This application claims the benefit of priority under 35 U.S.C. § 119(e) to U.S. Provisional Application No. 62/379, 174, filed on Aug. 24, 2016, and titled "CIRCUIT BOARD WELDED TO BATTERY CELL USING A CIRCUIT BOARD THROUGH HOLE AND METHODS FOR WELDING THE CIRCUIT BOARD," the disclosure of which is incorporated herein by reference in its entirety.

FIELD

The following description relates to welding techniques between a circuit board and another component. In particular, the following description relates to welding a circuit board to the component using a through hole of the circuit board. The welding techniques can reduce the number of steps use to secure the circuit board to the component as well as reduce the amount of space occupied by the circuit board and the component, as the circuit board is spaced closer to the component.

BACKGROUND

Using a tab, a circuit board can be secured to a battery pack, or an electrode of the battery pack. The circuit board and the battery pack may be inserted into an electronic device such as a smartphone. The tab is designed as a bendable tab that bends or folds in a location, and the bendable tab remains in the bend or folded configuration. Initially, the tab is secured to the circuit board and the electrode. Then, the bendable tab is bent, thereby moving and positioning the circuit board next to the battery pack.

However, the bendable tab includes several drawbacks. For instances, the bending operation of the tab can lead to inconsistent placement of the circuit board relative to the battery pack. Also, the positioning the circuit board in a desired location relative to the battery pack depends upon the dimensions of the tab. In this regard, individual tabs may vary in thickness (that is, one tab may include a different thickness than another tab), and as a result, the bend radius of the tab may also vary. This may lead to inconsistent placement of the circuit board relative to the battery pack.

Furthermore, in regard to spacing between the circuit board and the battery pack, a tab having a thickness T and bent to include a 180-degree bend requires the spacing to be least 2 T, plus any space between the two non-bent areas of the tab. As such, the bending operation may create unwanted spacing, which leads to either additional dedicated room for the circuit board and the battery pack, or a reduced battery pack that provides less power for the electronic device.

SUMMARY

In one aspect, a printed circuit board is described. The printed circuit board may include a substrate that includes a trace that is formed of electrically conductive material, the substrate including a first surface and a second surface opposite the first surface. The substrate may further include a through hole that extends from a first opening at the first surface to a second opening at the second surface. The printed circuit board may further include an electrically conductive pad disposed on the first surface and electrically coupled to the trace. In some instances, the pad at least partially surrounds the first opening. Also, the printed circuit board may include an electrically conductive tab that is accessible via the through hole and the second opening and that is electrically coupled to the electrically conductive pad. In some embodiments, the electrically conductive tab electrically connects an external electrical component to the trace by way of the electrically conductive pad.

In another aspect, an electronic device is described. The electronic device may include a circuit board that includes an opening. The electronic device may further include an electrical pad disposed on the circuit board. The electronic device may further include an internal power supply that includes an electrode. The electronic device may further include a tab engaging the electrical pad and electrode. In some embodiments, the tab bonds with the electrical component by a weld. The weld may be in a location corresponding to the opening.

In another aspect, a method for assembling a substrate with an internal component of an electronic device is described. The substrate may include a through hole and an electrical pad at least partially surrounding the through hole. The method may include engaging a tab with the electrical pad and the internal component. The method may further include receiving heat through the through hole. The method may further include bonding the tab with a terminal of the internal component.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
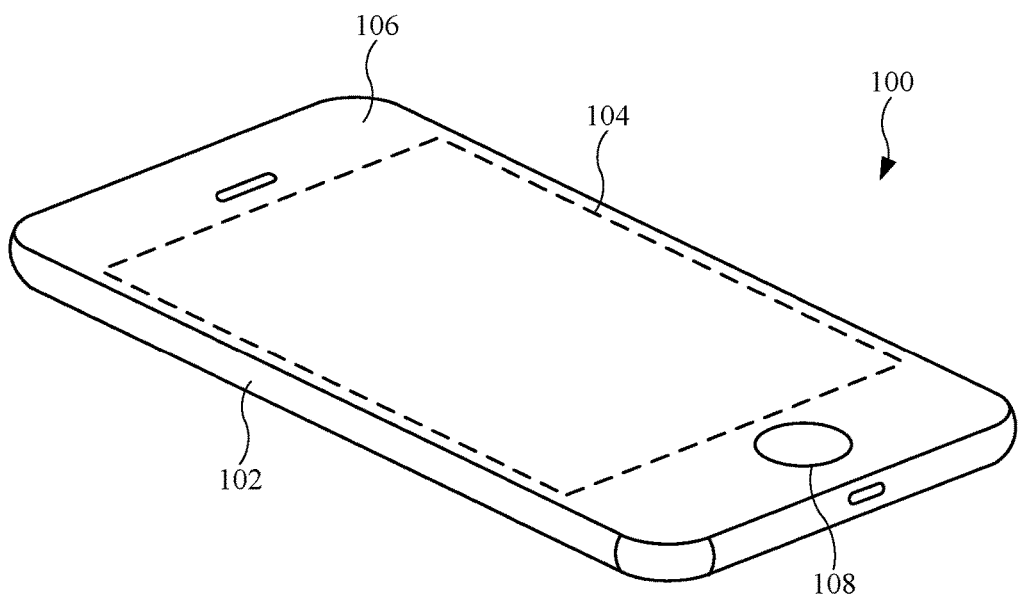
FIG. 1 illustrates an isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an electronic device that includes a circuit board coupled to a battery by a tab. The circuit board may include an opening, or through hole, that allows for a welding operation to bond the tab with the battery, and in particular, a battery electrode of the battery. The welding operation may include laser welding, as a non-limiting example. Using the opening for the bonding operation, the tab may not require any folding or bending to position the circuit board, thereby reducing the number of operation steps and eliminating improper placement of the circuit board due to the bending of the tab. As a result, the circuit board can be mounted in a desired location and then bonded with the battery electrode by the bonding operation. This may also save space in the electronic device, as the tab may include a generally flat or planar tab, as opposed to a folded tab that includes two non-bent portions facing each other. Moreover, the flat tab may include less material and provide a cost savings as well reduce the overall weight of the electronic device.

In some instances, when the circuit board is coupled with the battery electrode, the circuit board is separated from an additional battery electrode. In this regard, a spacing element coupled with the circuit board may also couple with the additional battery electrode. The spacing element may include a variety of designs and functions. For example, the spacing element may include a leaf spring design that bends in response to contact with the battery electrode. As another example, the spacing element may include a cantilevered design that also bends in response to contact with the battery electrode.

In addition bonding a tab with a battery, the welding operation may be used to bond other components in the electronic device. For example, multiple circuit boards may be coupled with one another by welding together multiple tabs, with each tabs coupled with a circuit board. Alternatively, a circuit board may couple with a housing of the electronic device by welding a tab with the housing. Also, the tabs may include various configurations to maintain the circuit board with the housing. For example, the tab may include a preloaded tab pressed against the housing while the preloaded tab is welded with the housing. Also, a compressible material can be positioned between the circuit board and the housing to provide support to the circuit board as well as provide a force to the circuit board to maintain the circuit board in contact with the tab.

These and other embodiments are discussed below with reference to FIGS. 1-21. However, those skilled in the art will readily appreciate that the detailed description given herein with respect to these Figures is for explanatory purposes only and should not be construed as limiting.

FIG. 1 illustrates an isometric view of an embodiment of an electronic device 100, in accordance with some described embodiments. In some embodiments, the electronic device 100 is a desktop computing device. In other embodiments, the electronic device 100 is a tablet computing device. Still, in other embodiments, the electronic device 100 is a wearable electronic device. In the embodiment shown in FIG. 1, the electronic device 100 is a mobile communication device, such as a smartphone.

The electronic device 100 may include an enclosure 102, or housing, that defines an internal cavity to receive several internal components (not shown), such as a circuit board, processor circuit, memory circuit, and an internal power supply, as non-limiting examples. The enclosure 102 may include a metal, such as aluminum or steel, or a metal alloy that includes two or more metals. Alternatively, the enclosure 102 may include a non-metal material (or materials), such as ceramic.

The electronic device 100 may further include a display assembly 104 (shown as a dotted line) designed to present visual information, in the form of still images and/or video. The display assembly 104 may include a capacitive touch sensitive layer designed to receive a touch input to alter the visual information. Also, the electronic device 100 may include a protective cover 106 that overlays the display assembly 104. The protective cover 106 may include a transparent material, such as glass or sapphire, as non-limiting examples.

The electronic device 100 may further include a button 108 used a control input to a processor circuit (not shown). For example, the button 108 may depress in response to a force, and provide a control that alters the visual information presented by the display assembly 104. Also, although not shown, the electronic device 100 may include one or more buttons disposed along the enclosure 102 to provide an additional control input.

Figure 2:
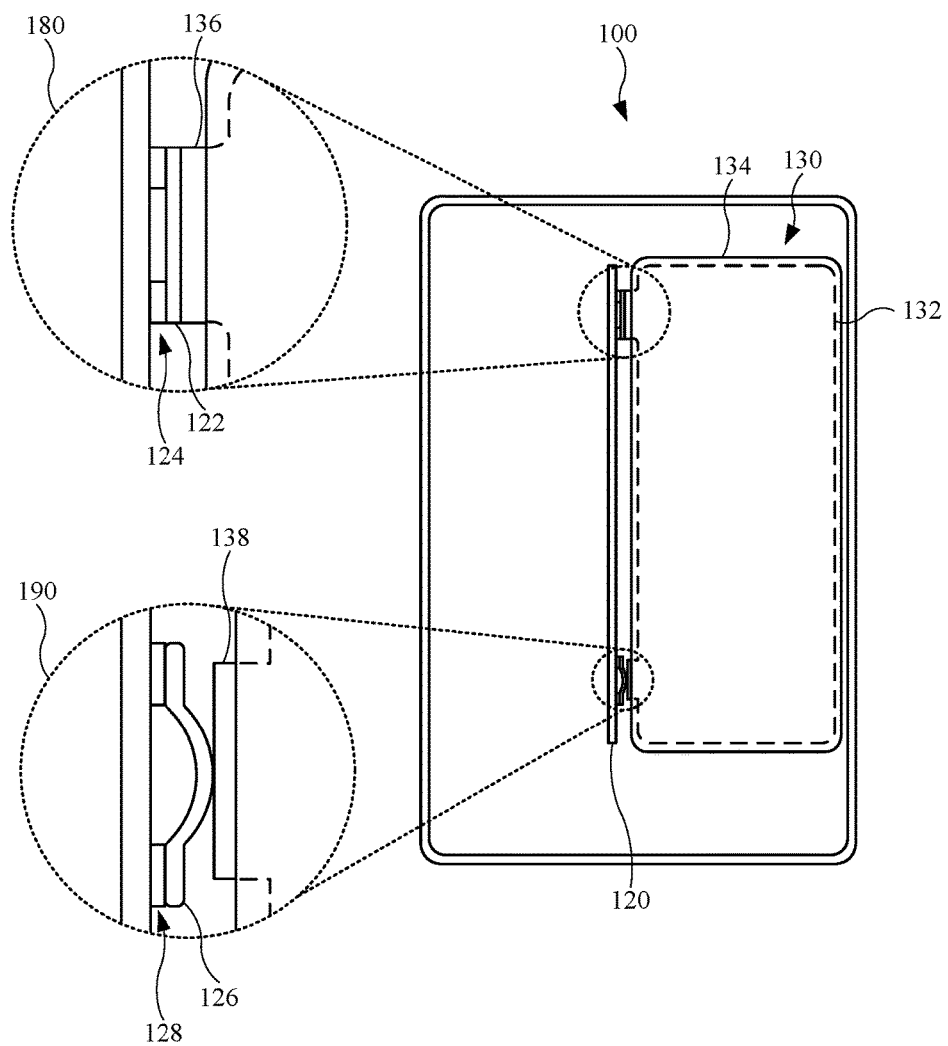
FIG. 2 illustrates a plan view of the electronic device in FIG. 1, showing a substrate and an internal power supply.

FIG. 2 illustrates a plan view of the electronic device 100 in FIG. 1, showing a substrate 120 and an internal power supply 130. For purposes of illustration, the display assembly 104 and the protective cover 106 (both shown in FIG. 1) are removed. The substrate 120 may include a circuit board, including a printed circuit board or a flexible circuit board. The internal power supply 130 may include a cell 132 (for example, a battery cell) surrounded by a can 134. The internal power supply 130 may provide power to various internal components (not shown) of the electronic device 100.

As shown, the substrate 120 is coupled with the internal power supply 130. For example, as shown in a first enlarged view 180, the substrate 120 includes a tab 122. The tab 122 may include a metal, such as aluminum or nickel. Also, the tab 122 can take the form of a plaque suitable for use in a soldering operation. Also, the tab 122 may electrically couple to a first electrical pad 124 disposed on the substrate 120. Further, a bonding operation, such as soldering operation, may reflow solder (not shown) positioned on the first electrical pad 124 and the tab 122 in order to electrically and mechanically couple the tab 122 with the first electrical pad 124.

As shown, the tab 122 is coupled with a first electrode 136 of the internal power supply 130, which may include an electrical coupling between the tab 122 and the first electrode 136. The first electrode 136 is one of two electrodes, or terminals, the internal power supply 130, with one electrode being positive and one electrode being negative. The tab 122 may be bonded with the first electrode 136 by a welding operation. For example, a laser welding operation that provides thermal energy by a laser beam that passes through an opening (not shown) of the circuit board and contacts the tab 122 to at least partially melt the tab 122 and the first electrode 136, and form a bond between the tab 122 and the first electrode 136. This will be shown and described below.

In some instances, the tab 122 includes a U-shape or other bent configuration. However, in order to reduce the space or volume occupied by the substrate 120 and the internal power supply 130, it may be desirable to minimize the size and shape of the tab 122. In this regard, the tab 122 shown in FIG. 2 includes a generally flat or planar metal element, and accordingly, minimizes the space between the substrate 120 and the internal power supply 130, as compared to a U-shaped or bent tab.

Further, as shown in a second enlarged view 190, the internal power supply 130 include a second electrode 138 electrically coupled with a spacing element 126 secured with the substrate 120 by way of a second electrical pad 128 disposed on the substrate 120. The second electrode 138 may include a negative electrode. However, the location of the first electrode 136 and the second electrode 138 may be reversed in other configurations. The spacing element 126 may include an electrically conductive material, such as a metal, and accordingly, may provide an electrical pathway between the second electrode 138 and the second electrical pad 128.

In some instances, the second electrode 138 is non-coplanar with respect to the first electrode 136. However, the spacing element 126 provides an additional extension such that the second electrode 138 contacts the spacing element 126, and the internal power supply 130 remains electrically coupled with the substrate 120 by way of the first electrode 136 and the second electrode 138.

Also, the spacing element 126 shown in FIG. 2 may include a leaf spring design, allowing the spacing element 126 to flex or bend in response to a force provided by the second electrode 138, when, for example, the internal power supply 130 moves with respect to the substrate 120. Also, the spacing element 126 may flex or bend to accommodate some differences in positioning between the substrate 120 and the internal power supply 130, and in particular, the second electrode 138. Alternatively, or in combination, the spacing element 126 is designed may accommodate different tolerance (sizes) of the substrate 120 and/or the internal power supply 130, which may facilitate an assembly operation of the substrate 120 and the internal power supply 130. While a leaf spring configuration is shown for the spacing element 126, other configurations are possible, and will be shown below.

FIGS. 3-6 show and describe substrates having different electrical pad configurations. The electrical pad configurations shown in FIGS. 3-6 may be used by any substrate shown and described herein. Also, the electrical pads, in each configuration, or design to receive and electrically couple with a tab or another electrical component. In this regard, the electrical pads may include a material such as gold or copper, and as a result, allow for a bonding operation, such as soldering, to electrically and mechanically couple with the tab or other electrical component. Further, although FIGS. 3-6 show a single surface of a substrate having electrical pad (or pads) in a particular configuration, an additional surface of the substrate may include an electrical pad (or pads) in a similar configuration as shown for the single surface.

Figure 3:
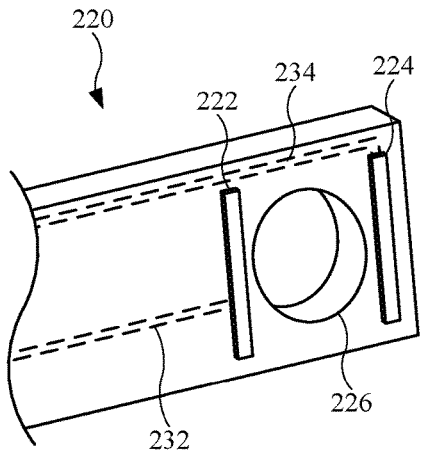
FIG. 3 illustrates an isometric view of an alternate embodiment of a substrate having a pair of electrical pads in the form of parallel plates.

FIG. 3 illustrates an isometric view of an alternate embodiment of a substrate 220 having a pair of electrical pads in the form of parallel plates. As shown, the electrical pads include a first electrical pad 222 and a second electrical pad 224 parallel to the first electrical pad 222. Also, the first electrical pad 222 and the second electrical pad 224 may surround an opening 226, or through hole, formed in the substrate 220. The opening 226 may provide a path for a laser welding operation to weld together a tab (now shown) with the first electrical pad 222 and the second electrical pad 224. Also, the substrate 220 may include a first metal trace 232 and a second metal trace 234 (also referred to as traces) that extend internally along the substrate 220 to electrically couple the first electrical pad 222 and the second electrical pad 224, respectively, to other component(s) (not shown) of the substrate 220.

Figure 4:
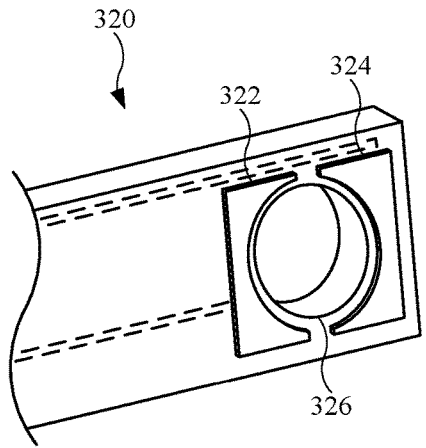
FIG. 4 illustrates an isometric view of an alternate embodiment of a substrate having a pair of electrical pads partially surrounding an opening of the substrate.

FIG. 4 illustrates an isometric view of an alternate embodiment of a substrate 320 having a pair of electrical pads partially surrounding an opening 326 of the substrate 320. As shown, the electrical pads include a first electrical pad 322 and a second electrical pad 324 that combine to surround the opening 326. Further, the first electrical pad 322 and the second electrical pad 324 may extend along an outer perimeter of the opening 326 and provide additional surface area (as compared to the pads in FIG. 3) that is used to couple with a component (not shown). Although not labeled, the substrate 320 includes metal traces that electrically connect the first electrical pad 322 and the second electrical pad 324 with another electrical pad and/or an electrical component (not shown) coupled to the substrate 320.

Figure 5:
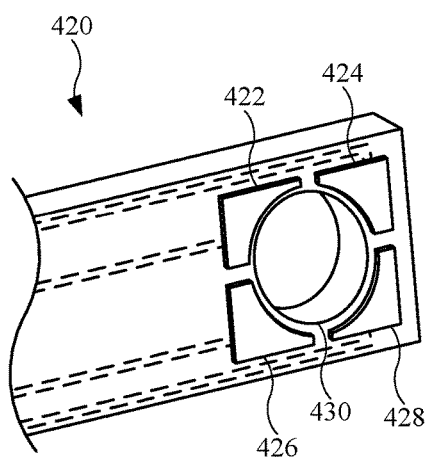
FIG. 5 illustrates an isometric view of an alternate embodiment of a substrate having multiple electrical pads partially surrounding an opening of the substrate.

FIG. 5 illustrates an isometric view of an alternate embodiment of a substrate 420 having multiple electrical pads partially surrounding an opening 430 of the substrate 420. As shown, the electrical pads include a first electrical pad 422, a second electrical pad 424, a third electrical pad 426, and a fourth electrical pad 428 that combine to surround the opening 430. As shown, the electrical pads extend around an outer perimeter of the opening 430 and provide a bonding location for a component. Further, the electrical pads are broken into multiple segments, which may reduce the amount of material used, as compared to the electrical pads in FIG. 4. Although not labeled, the substrate 320 includes metal traces that electrically connect the first electrical pad 422, the second electrical pad 424, the third electrical pad 426, and the fourth electrical pad 428 with another electrical pad and/or an electrical component (not shown) coupled to the substrate 320.

Figure 6:
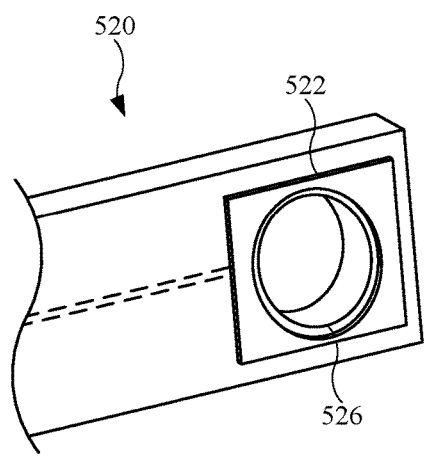
FIG. 6 illustrates an isometric view of an alternate embodiment of a substrate having an electrical pad surrounding an opening of the substrate.

FIG. 6 illustrates an isometric view of an alternate embodiment of a substrate 520 having a single electrical pad surrounding an opening 526 of the substrate 520. As shown, an electrical pad 522 fully sounds an outer perimeter of the opening 526, allowing a component (not shown) to couple with the electrical pad 522 in any rotational orientation with respect to the substrate 520. Although not labeled, the substrate 520 includes metal traces that electrically connect the electrical pad 522 with another electrical pad and/or an electrical component (not shown) coupled to the substrate 520.

Figure 7:
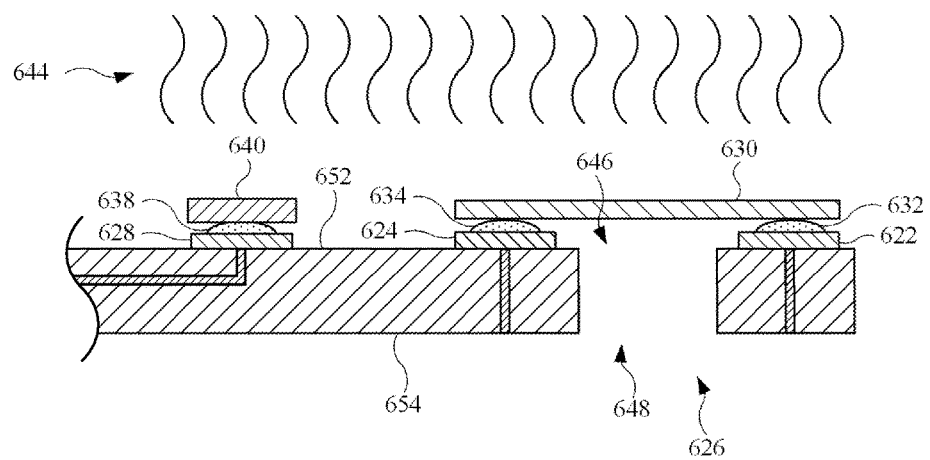
FIG. 7 illustrates a cross sectional view of an embodiment of a substrate, showing the substrate undergoing a reflow operation in order to solder components to the substrate, in accordance with some described embodiments.

FIG. 7 illustrates a cross sectional view of an embodiment of a substrate 620, showing the substrate 620 undergoing a reflow operation in order to solder components to the substrate 620, in accordance with some described embodiments. As shown, the substrate 620 includes electrical pads, such as a first electrical pad 622 and a second electrical pad 624 that surround an opening 626 of the substrate 620. The opening 626 can be characterized as a through hole that extends from a first opening 646 at a first surface 652 of the substrate 620 to a second opening 648 at a second surface 654 of the substrate 620.

As shown, a tab 630 is disposed over the first electrical pad 622 and the second electrical pad 624. The tab 630 may be positioned over the first opening 646 such that the tab 630 may undergo an additional bonding operation with another component. This will be shown and described below. Although a particular size and number of electrical pads are shown, the electrical pads may vary in size and number.

The reflow operation may include a soldering operation that provides heat 644 to a first solder material 632 and a second solder material 634, thereby bonding the tab 630 with the first electrical pad 622 and the second electrical pad 624. The heat is sufficient to melt the first solder material 632 and the second solder material 634 such that the tab 630 bonds and electrically couples with the first electrical pad 622 and the second electrical pad 624. Also, the tab 630 may be positioned over the opening 626.

In addition to the tab 630, some components, such as integrated circuits or electrical components, can be secured with the substrate 620. For example, the substrate 620 may include a third pad 628 having a component 640 disposed on the third pad 628, with the reflow operation melting a third solder material 638 to electrically and mechanically couple the component 640 with the third pad 628. Also, while a single component, represented by the component 640, is shown, several additional components may be coupled with the substrate 620 in a manner similar to that of the component 640.

Figure 8:
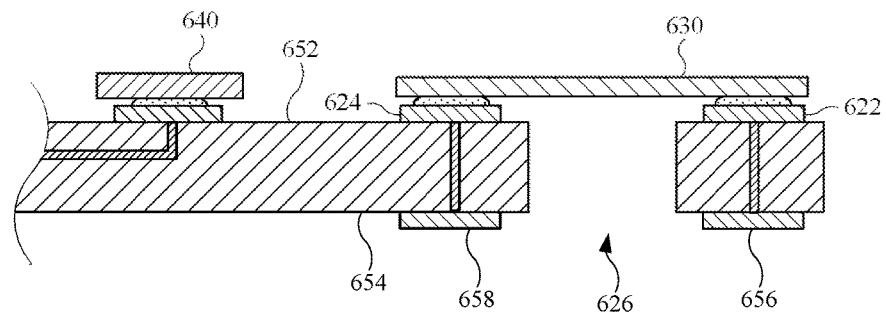
FIG. 8 illustrates a cross sectional view of the substrate shown in FIG. 7 subsequent to the reflow operation.

FIG. 8 illustrates a cross sectional view of the substrate 620 shown in FIG. 7 subsequent to the reflow operation. As shown, the tab 630 and the component 640 are electrically and mechanically coupled with the substrate 620 via the solder materials described above. Also, as shown, both the tab 630 and the component 640 are bonded with a first surface 652 of the substrate 620. However, the substrate 620 includes a second surface 654, opposite the first surface, that may also receive a tab (not shown) or another component. In this regard, electrical pads, such as a third electrical pad 656 and a fourth electrical pad 658, may be positioned on the second surface 654. The third electrical pad 656 and the fourth electrical pad 658 may include a configuration as that of the first electrical pad 622 and the second electrical pad 624, respectively. Alternatively, the third electrical pad 656 and the fourth electrical pad 658 may include a different configuration than the first electrical pad 622 and the second electrical pad 624. Also, in some embodiments (not shown), the first electrical pad 622 and the second electrical pad 624 extend through the substrate 620 such that the first electrical pad 622 and the second electrical pad 624 protrude beyond the substrate 620 at both the first surface 652 and the second surface 654. Accordingly, in these embodiments, the third electrical pad 656 and the fourth electrical pad 658 are removed.

Figure 9:
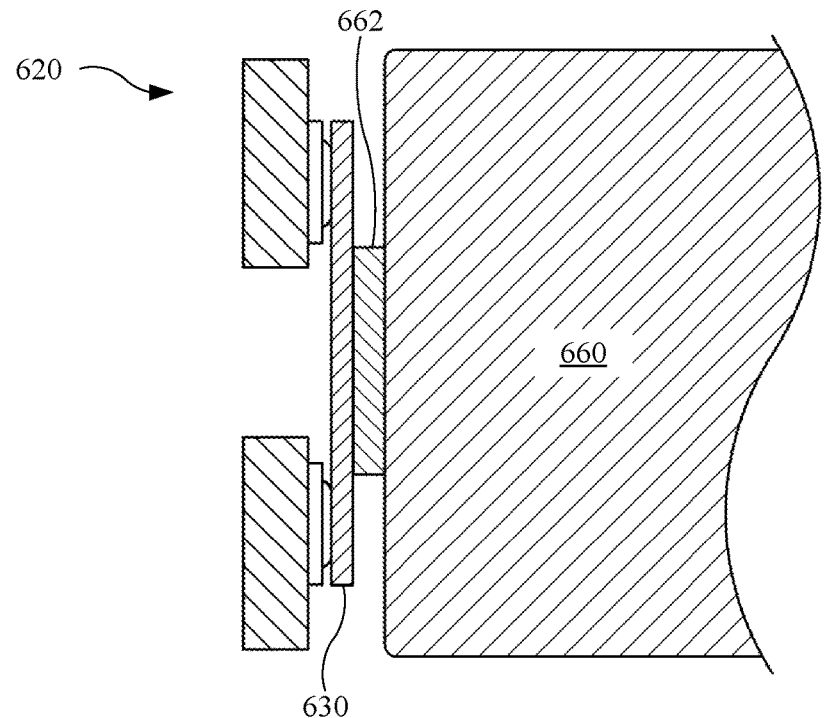
FIG. 9 illustrates a cross sectional view of the substrate secured with the internal power supply with the tab positioned against an electrode of the internal power supply.

FIG. 9 illustrates a cross sectional view of the substrate 620 secured with the internal power supply, with the tab 630 positioned against an electrode 662 of the internal power supply 660. Although not shown, a fixture may hold the substrate 620 in place and in a desired location relative to the internal power supply 660, such that the tab 630 engages the electrode 662.

Figure 10:
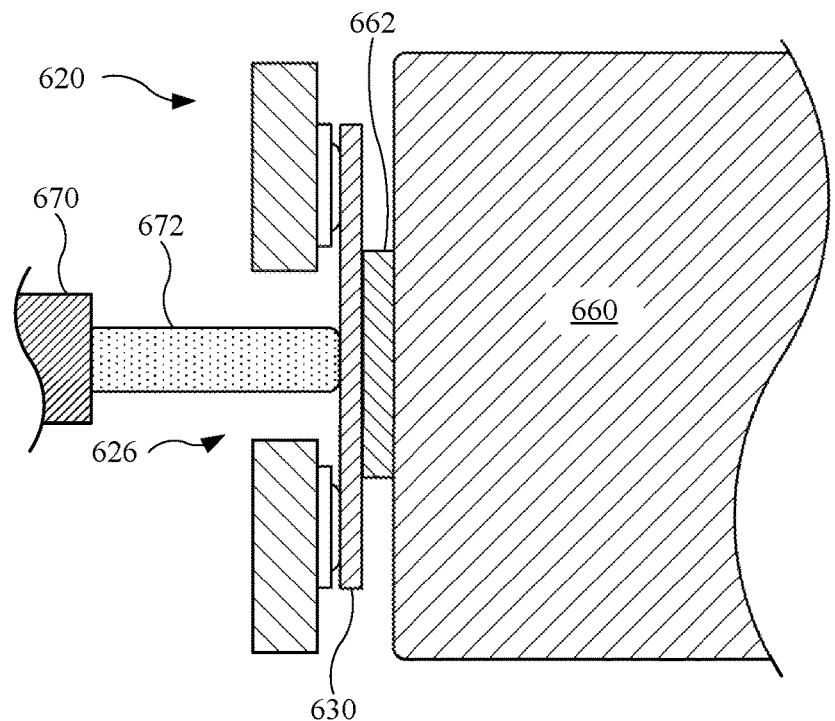
FIG. 10 illustrates a cross sectional view of the substrate and the internal power supply shown in FIG. 9, further showing the tab undergoing a bonding operation to weld the tab with the electrode.

FIG. 10 illustrates a cross sectional view of the substrate 620 and the internal power supply 660 shown in FIG. 9, further showing the tab 630 undergoing a bonding operation to weld the tab 630 with the electrode 662. As shown, a tool 670 is used to perform the bonding operation. In some embodiments, the tool 670 is a laser welding tool that emits a laser beam 672 to provide heat to weld the tab 630 with the electrode 662. Further, the tool 670 is positioned such that the laser beam 672 passes through the opening 626 of the substrate 620. The laser beam 672 may supply sufficient heat to melt the together materials that form the tab 630 and the electrode 662, which may include nickel and aluminum materials, as an example. Further, the laser beam 672 may be sufficiently tuned or focused such that an outer perimeter of the laser beam 672 supplies relatively less heat, as compared to a central area of the laser beam 672, to avoid damage to the substrate 620.

Figure 11:
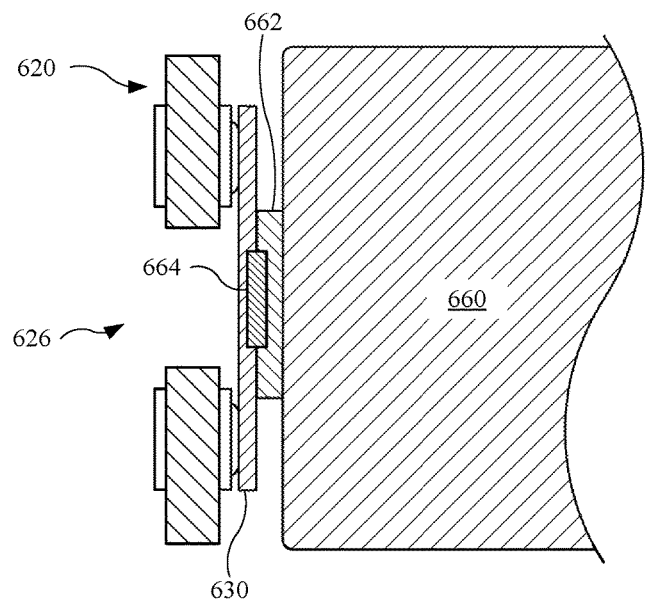
FIG. 11 illustrates a cross sectional view of the substrate and the internal power supply shown in FIG. 10, showing the tab welded with the electrode.

FIG. 11 illustrates a cross sectional view of the substrate 620 and the internal power supply 660 shown in FIG. 10, showing the tab 630 welded with the electrode 662. As shown, the tab 630 is bonded with the electrode by a weld 664 between the tab 630 and the electrode 662, and accordingly, the substrate 620 is secured with the internal power supply 660. By locating the substrate 620 in a desired location relative to the internal power supply 660 and then welding the tab 630 (as shown in FIG. 10), the substrate 620 is welded and secured with the internal power supply 660, and need not be repositioned by another process or processes. Accordingly, the process shown in FIG. 11 eliminates the need for a bendable tab. Also, as the tab 630 is generally flat or planar, the space occupied by the tab 630 is minimized, thereby reducing the overall space occupied by the substrate 620 and the internal power supply 660, as the substrate 620 can be positioned closer to the internal power supply 660, as opposed to using a bent or folded tab. Also, it should be noted that the location of the weld 664 corresponds to the location of the opening 626, as the welding operation is performed through the opening.

Also, the welding operation is possible in part by the opening 626 and the location of the tab 630 relative to the opening 626. In other words, the opening 626 provides access to the tab 630 for a welding operation (shown in FIG. 10) such that the substrate 620 can be positioned in accordance with a desired manner and need not be repositioned after the welding operation. This reduces manufacturing times and eliminates misalignment of the substrate 620.

Figure 12:
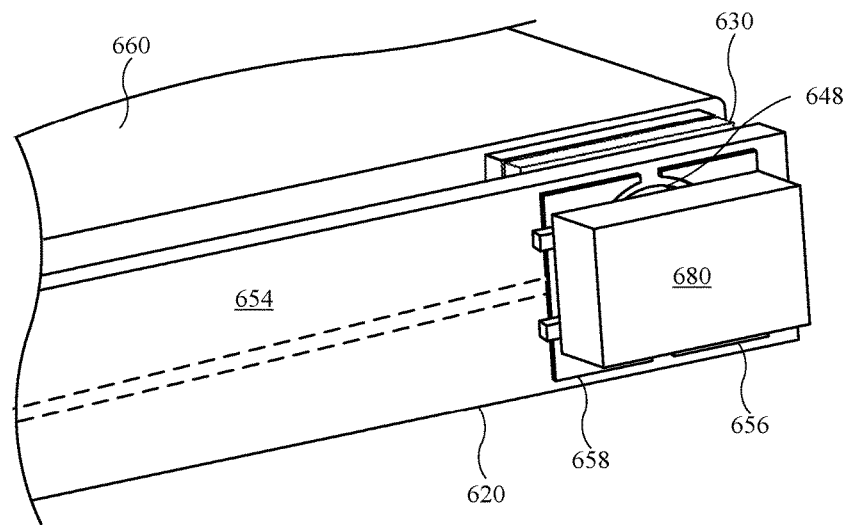
FIG. 12 illustrates an isometric view of the substrate and the internal power supply shown in FIG. 11, further showing a component secured with the substrate on an opposing surface of the substrate.

In some instances, the substrate 620 is limited in size. In this regard, both surfaces of the substrate 620 may be configured to receive components. For example, FIG. 12 illustrates an isometric view of the substrate 620 and the internal power supply 660 shown in FIG. 11, further showing a component 680 secured with the substrate 620 on an opposing surface of the substrate 620. The component 680 may include an electrical component, such as a processing circuit, as a non-limiting example. As shown, the component 680 is located on the second surface 654 of the substrate 620, with the tab 630 is located on the first surface 652 (labeled in FIG. 8). Further, the component 680 may electrically couple with the third electrical pad 656 and the fourth electrical pad 658. This may include an additional bonding operation that includes soldering the component 680 with the third electrical pad 656 and the fourth electrical pad 658 using solder material (not shown). Moreover, to further utilize limited space on the second surface 654, the component 680 may be positioned over the second opening 648, as shown in FIG. 12.

Figure 13:
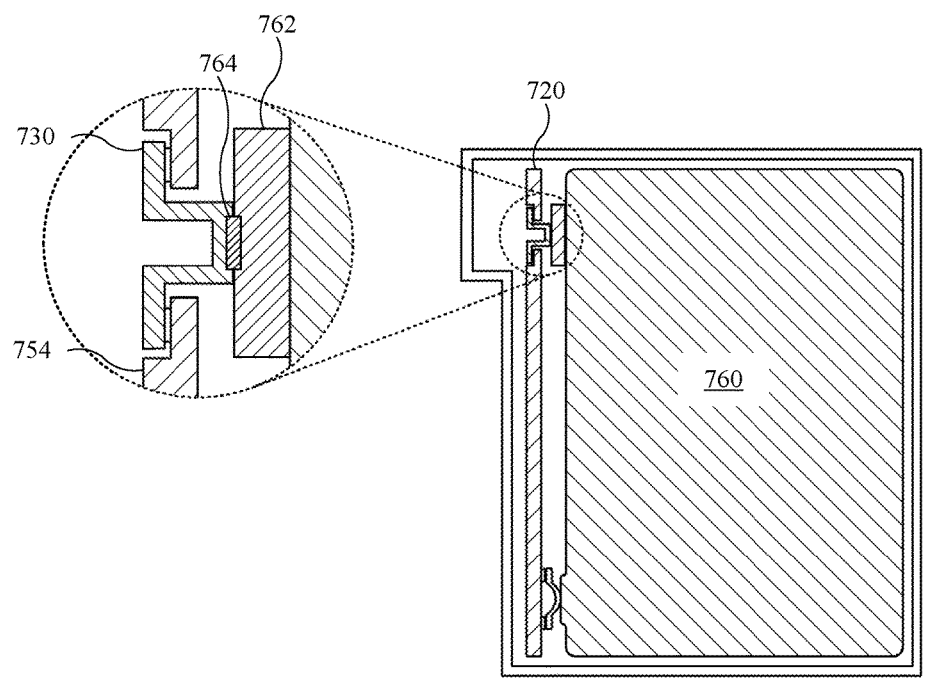
FIG. 13 illustrates a partial cross sectional view of a substrate secured with an internal power supply by a tab.

FIG. 13 illustrates a partial cross sectional view of an alternate embodiment of a substrate 720 secured with an internal power supply 760 by a tab 1130. The substrate 720 may include a circuit board. As shown, the tab 1130 is electrically and mechanically coupled with an electrode 762 of the internal power supply 760 by a weld 764. The weld 764 may be performed by a welding operation in a manner previously described. As shown in the enlarged view, the substrate 720 may include stepped profile such that the tab 730 is co-planar, or flush, with respect to a surface 754 of the substrate 720. Inn some embodiments (not shown), the stepped profile of the substrate 720 includes size and shape such that the tab 730 is non-coplanar, or sub-flush, with respect to the surface 754.

Figure 14:
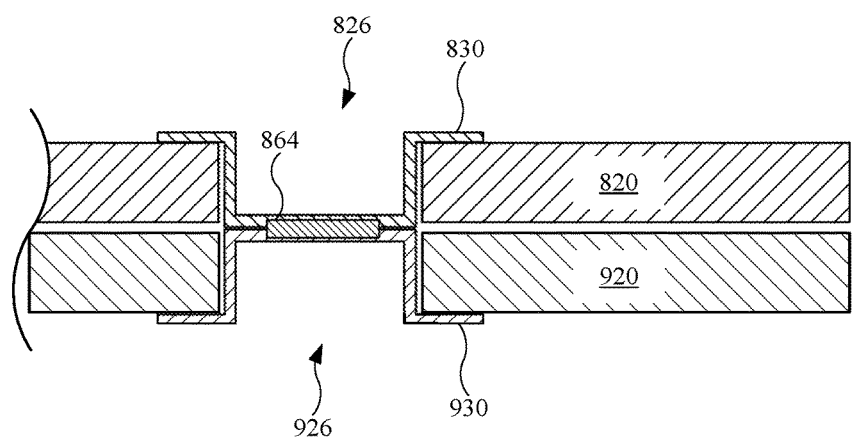
FIG. 14 illustrates a cross sectional view of a first substrate secured with a second substrate by a pair of tabs welded together.

In addition to bonding a tab with an electrode, the welding operation described herein may bond together different components. For example, FIG. 14 illustrates a cross sectional view of a first substrate 820 secured with a second substrate 920 by a pair of tabs welded together. The first substrate 820 and the second substrate 920 may include a first circuit board and a second circuit board, respectively. As shown, the first substrate 820 may include a first opening 826 that receives a first tab 830, and the second substrate 920 may include a second opening 926 that receives a second tab 030. A tool, such as the tool 670 (shown in FIG. 10), may provide a laser welding operation to a weld 864 between the first tab 830 and the second tab 930, thereby securing the first substrate 820 with the second substrate 920. Further, when the substrates are circuit boards, the bond between the first tab 830 and the second tab 930 may represent a board-to-board connection.

Figure 15:
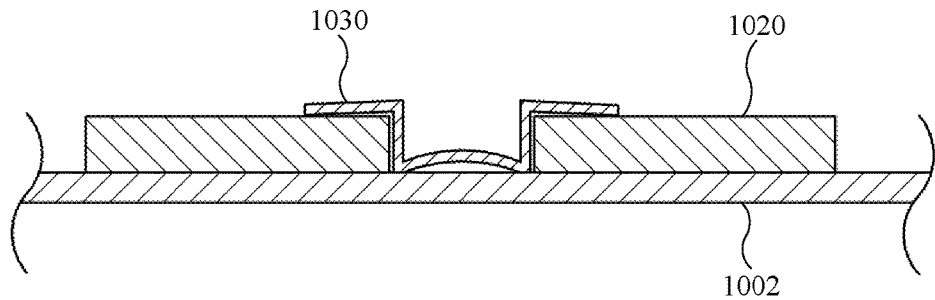
FIG. 15 illustrates a cross sectional view of an embodiment of a tab used to secure a substrate with a housing.

FIG. 15 illustrates a cross sectional view of an embodiment of a tab 1030 used to secure a substrate 1020 with a housing 1002. The housing 1002 may include a housing or enclosure of an electronic device, such as the enclosure 102 and electronic device 100 (shown in FIG. 1). As shown, prior to bonding with the housing 1002, the tab 1030 is configuration a preloaded arrangement, similar to a preloaded or compressed arrangement of a spring.

Figure 16:
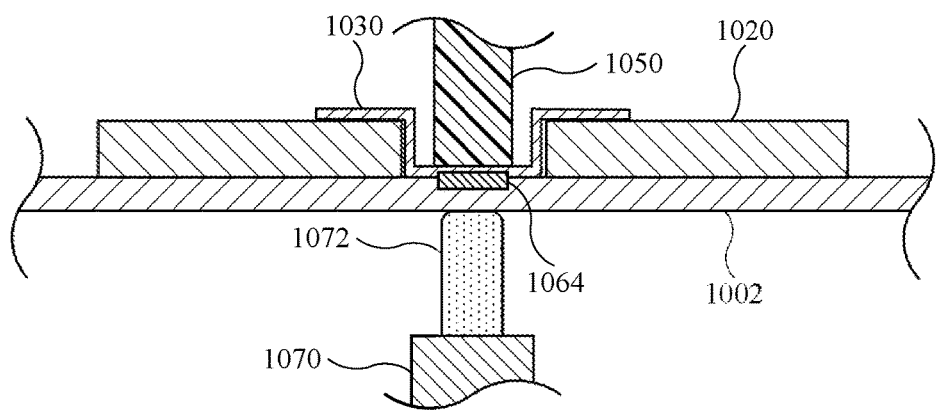
FIG. 16 illustrates a cross sectional view of the tab shown in FIG. 15, showing the tab pressed against the housing and undergoing a welding operation to weld the tab with the housing.

FIG. 16 illustrates a cross sectional view of the tab 1030 shown in FIG. 15, showing the tab 1030 pressed against the housing 1002 and undergoing a welding operation to weld the tab 1030 with the housing 1002. As shown, an object 1050, such as a rod, may press against the tab 1030 such that the tab 1030 lies flat against the housing 1002. Then, a tool 1070 is used to perform the bonding operation. In some embodiments, the tool 1070 is a laser welding tool that emits a laser beam 1072 to provide heat to weld the tab 1030 with the housing 1002, thereby forming a weld 1064 between the tab 1030 and housing 1002. Although not shown, subsequent to the bonding operation, when the object 1050 is removed, the tab 1030 remains flat against the housing 1002. In other words, the tab 1030 is no longer in the preloaded arrangement. In this regard, the tab 1030 may provide a force to the substrate 1020 causing the substrate 1020 to remain engaged with the housing 1002.

Figure 17:
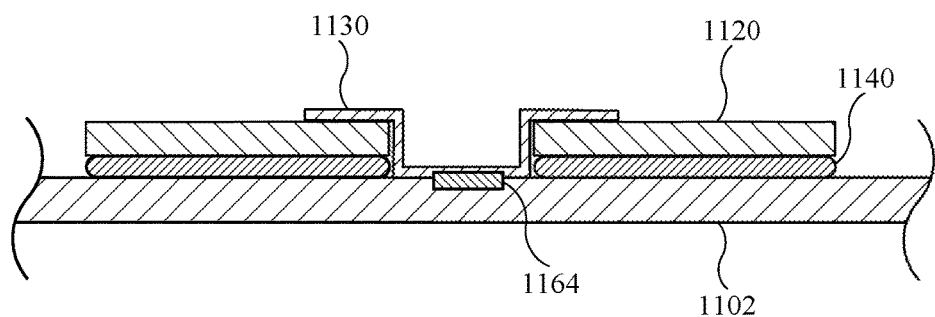
FIG. 17 illustrates a cross sectional view of an embodiment of a tab used to secure a substrate with a housing, further showing a compressible material positioned between the substrate and the housing.

FIG. 17 illustrates a cross sectional view of an embodiment of a tab 1130 used to secure a substrate 1120 with a housing 1102, further showing a compressible material 1140 positioned between the substrate 1120 and the housing 1102. The compressible material 1140 may include a compressible foam or compressible adhesive, as non-limiting examples. As shown, the tab 1130 is secured with the housing 1102 by weld 1164 formed from a welding operation in a manner previously described. In this configuration, the compressible material 1140 may provide a cushion for the substrate 1120 against a force to the housing 1102. Further, when the tab 1130 secures the substrate 1120 with the housing 1102, the compressible material 1140 may provide a force to the substrate 1120 causing the substrate 1120 to remain engaged with the tab 1130.

Returning to FIG. 2, the spacing element 126 may span the distance between the second electrical pad 128 and the second electrode 138 to electrically couple the second electrical pad 128 with the second electrode 138. As shown in FIG. 2, the spacing element 126 includes a leaf spring designed to bend or flex in response to a force to the spacing element 126. However, other configurations of a spacing element are possible.

Figure 18:
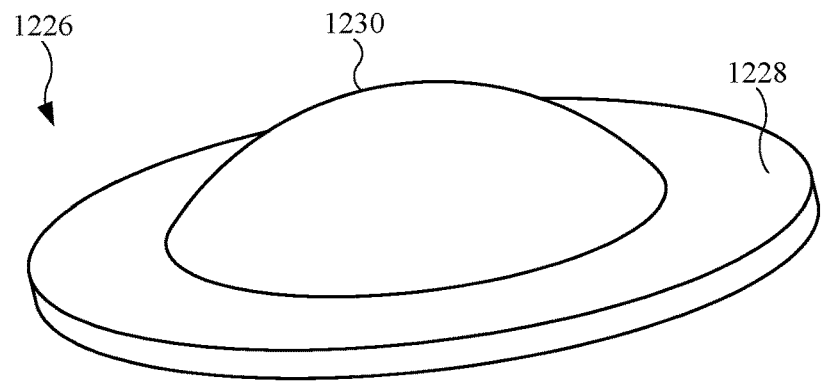
FIG. 18 illustrates an isometric view of an embodiment of a spacing element having a dome configuration.
Figure 19:
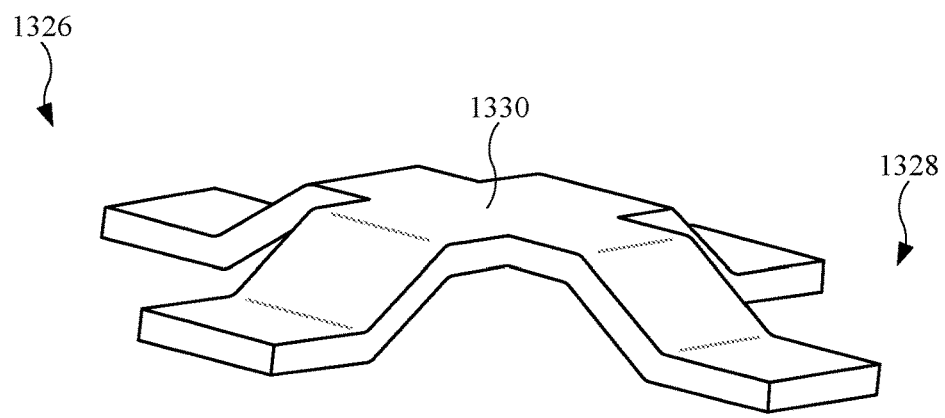
FIG. 19 illustrates an isometric view of an alternate embodiment of a spacing element having a cross configuration.
Figure 20:
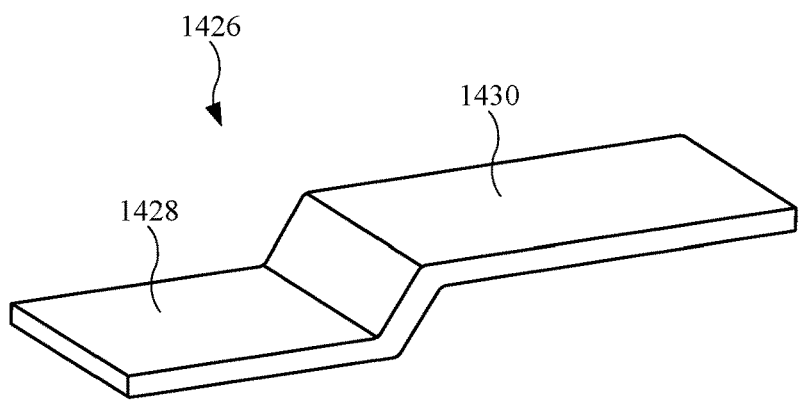
FIG. 20 illustrates an isometric view of an alternate embodiment of a spacing element having a cantilevered configuration.

For example, FIGS. 18-20 show different configuration of a spacing element that may be used to electrically an electrode when an electrical pad. The spacing elements shown in FIGS. 18-20 may include an electrically conductive material, such as a metal. Also, the spacing element 126 (shown in FIG. 2) may be substituted for any spacing element shown in FIGS. 18-20.

FIG. 18 illustrates an isometric view of an embodiment of a spacing element 1226 having a dome configuration. The spacing element 1226 may include a base portion 1228 and a dome portion 1230 extending from the base portion 1228. In some embodiments, the base portion 1228 couples with an electrical pad (not shown), while the dome portion 1230 extends to engage an electrode (not shown). However, the configuration of the base portion 1228 and the dome portion 1230 may switch.

FIG. 19 illustrates an isometric view of an alternate embodiment of a spacing element 1326 having a cross configuration. The spacing element 1326 may include a base portion 1328 and an elevated portion 1330 extending from the base portion 1328. In some embodiments, the base portion 1328 couples with an electrical pad (not shown), while the elevated portion 1330 extends to engage an electrode (not shown). However, the configuration of the base portion 1328 and the elevated portion 1330 may switch. Also, the spacing element 1326 may bend or flex in response to a force. For example, a force provided to the elevated portion 1330 may compress, or reduce the height of, the spacing element 1326. This may be caused in part by a force from an electrode (not shown). Also, the flexible property of the spacing element 1326 may accommodate different tolerances in the components used, such as a substrate and/or an internal power supply.

FIG. 20 illustrates an isometric view of an alternate embodiment of a spacing element 1426 having a cantilevered configuration. The spacing element 1426 may include a base portion 1328 and a flexible portion 1430 extending from the base portion 1428. In some embodiments, the base portion 1428 couples with an electrical pad (not shown), while the flexible portion 1430 extends to engage an electrode (not shown). However, the configuration of the base portion 1428 and the flexible portion 1430 may switch. In either event, when the spacing element 1426 includes a cantilevered configuration, only the base portion 1428 is attached to an object. Also, the spacing element 1426 may bend or flex in response to a force. For example, a force provided to the flexible portion 1430 may compress, or reduce the height of, the spacing element 1326. This may be caused in part by a force from an electrode (not shown). Also, the flexible property of the spacing element 1426 may accommodate different tolerances in the components used, such as a substrate and/or an internal power supply.

Figure 21:
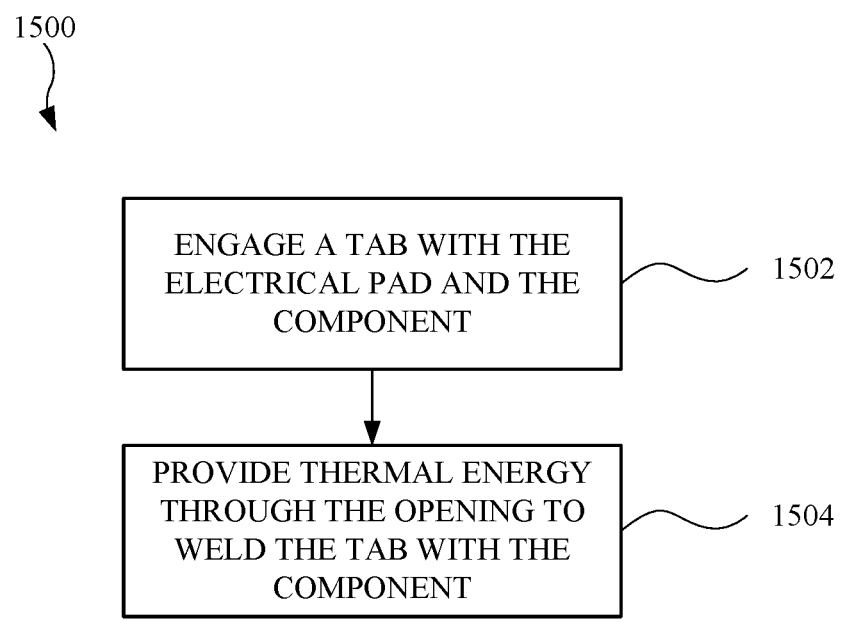
FIG. 21 illustrates a flowchart showing a method for assembling a circuit board with an internal component of an electronic device, in accordance with some described embodiments.

FIG. 21 illustrates a flowchart 1500 showing a method for assembling a circuit board with an internal component of an electronic device. The circuit board may include an opening and an electrical pad that at least partially surrounds the opening. The internal component may include an internal power supply that provides electrical current to several operational components in the electronic device. Also, the substrate may include a circuit board that carries at least some of the operational components, and is also in communication with the internal component.

In step 1502, a tab engages with the electrical pad and the internal component. The tab may include a flat or planar configuration. Also, the tab may include an electrically conductive material, such as a metal. In order to properly engage the tab with the internal component, a fixture may be used to align the substrate with the internal component.

In step 1504, thermal energy is provided through the opening to weld the tab with the component. A tool may provide the thermal energy. The tool may include a welding tool. Further, the welding tool may include a laser welding tool that emits a laser beam. The laser beam may provide sufficient heat to form a weld between the tab and the internal component. In some embodiments, the internal component includes an electrode. In this manner, the weld may bond the tab with the electrode.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A printed circuit board, comprising:
a substrate that includes a trace that is formed of electrically conductive material, the substrate including a first surface and a second surface opposite the first surface, the substrate further including a through hole that extends from a first opening at the first surface to a second opening at the second surface;
an electrically conductive pad disposed on the first surface and electrically coupled to the trace, wherein the pad at least partially surrounds the first opening;
an electrically conductive tab that is accessible via the through hole and the second opening and that is electrically coupled to the electrically conductive pad, wherein the electrically conductive tab electrically connects a first terminal of an external electrical component to the trace by way of the electrically conductive pad;
a second electrically conductive pad; and
a spacer that electrically couples the second electrically conductive pad to a second terminal of the external electrical component, the second terminal of the external electrical component positioned non-coplanar with the first terminal of the external electrical component.

2. The printed circuit board of claim 1, further comprising a weld at a location corresponding to the through hole that bonds the electrically conductive tab with the external electrical component.

3. The printed circuit board of claim 2, wherein the weld electrically couples the electrically conductive pad with the external electrical component.

4. The printed circuit board of claim 1, wherein the electrically conductive tab covers at least a portion of the first opening at the first surface.

5. The printed circuit board of claim 4, wherein the spacer covers the second opening at the second surface.

6. The printed circuit board of claim 1, wherein the electrically conductive pad surrounds the first opening at the first surface.

7. The printed circuit board of claim 6, wherein the circuit board comprises multiple electrically conductive pads that combine with the electrically conductive pad to surround the first opening at the first surface.

8. An electronic device, comprising:
a circuit board comprising an opening;
a first electrical pad and a second electrical pad disposed on the circuit board;
an internal power supply that includes a first electrode and a second electrode;
a tab engaging the first electrical pad and the first electrode, wherein the tab bonds with the electrode by a weld, the weld in a location corresponding to the opening; and
a spacing element electrically coupling the second electrode with the second electrical pad.

9. The electronic device of claim 8, wherein the circuit board comprises a first surface and a second surface opposite the first surface, and wherein the tab covers the opening at the first surface.

10. The electronic device of claim 9, further comprising a component electrically coupled with the circuit board and covering the opening at the second surface.

11. The electronic device of claim 10, wherein the circuit board comprises a stepped profile, and wherein the tab is positioned in the stepped profile such that the tab is coplanar with respect to the second surface.

12. The electronic device of claim 8, wherein the spacing element comprises a cantilevered spacing element.

13. The electronic device of claim 8, wherein the electrode is non-coplanar with respect to the second electrode.

14. A method for assembling a substrate with an internal component of an electronic device, the internal component comprising a battery that includes a terminal and a second terminal, the substrate having a through hole and an electrical pad at least partially surrounding the through hole, the method comprising:

engaging a tab with the electrical pad and the terminal of the internal component;

inserting a spacing element between the substrate and the internal component such that the spacing element engages a second electrical pad of the substrate and the second terminal;

receiving heat through the through hole; and bonding the tab with a terminal of the internal component.

15. The method of claim 14, wherein receiving the heat through the through hole comprises laser welding the tab and the terminal to form a weld between the tab and the terminal.

16. The method of claim 14, further comprising covering the through hole at a surface of the substrate.

17. The method of claim 16, further comprising covering the through hole at a second surface of the substrate, the second surface opposite the surface.

18. The method of claim 17, wherein covering the through hole at the second surface comprises electrically coupling a second internal component with the second surface.

* * * * *